United States Patent [19]
Sakanishi et al.

[11] Patent Number: 5,010,577
[45] Date of Patent: Apr. 23, 1991

[54] ELECTRONIC VOLUME DEVICE

[75] Inventors: Masayuki Sakanishi, Tokyo; Takaaki Ishii, Sagamihara, both of Japan

[73] Assignee: Kabushiki Kaisha Toshiba, Kawasaki, Japan

[21] Appl. No.: 262,649

[22] Filed: Oct. 26, 1988

[30] Foreign Application Priority Data

Oct. 29, 1987 [JP] Japan .................... 62-165985[U]

[51] Int. Cl.$^5$ .................................................. H03G 3/00
[52] U.S. Cl. .................................................. 381/104
[58] Field of Search ............... 381/104, 105, 106, 107, 381/108, 109

[56] References Cited

U.S. PATENT DOCUMENTS

| | | | |
|---|---|---|---|
| 4,349,779 | 9/1982 | Ono | 381/104 |
| 4,479,237 | 10/1984 | Sugasawa | 381/107 |
| 4,616,271 | 10/1986 | Yasukawa et al. | 381/107 |
| 4,797,932 | 1/1989 | Rohulich et al. | 381/104 |

FOREIGN PATENT DOCUMENTS 0143510 6/1987 Japan ..................... 381/104

Primary Examiner—Forester W. Isen
Attorney, Agent, or Firm—Finnegan, Henderson, Farabow, Garrett, and Dunner

[57] ABSTRACT

An electronic volume device of a chopper type in which a switching control unit thereof can be composed of a monolithic integrated circuit and which controls a quantity of attenuation of an analog signal input to the device by switching the analog signal at predetermined periods. A comparator compares the volume control data generated by a volume control data generator and the counts of a counter which counts clocks having a predetermined period to output a signal indicative of the result of the comparison. This signal controls a tri-state buffer, the output of which is used to switch the input signal.

11 Claims, 5 Drawing Sheets

ELECTRONIC VOLUME DEVICE

BACKGROUND OF THE INVENTION

1. Field of the Invention

This invention relates to an electronic volume device of a chopper type which controls the quantity of attenuation of an input analog signal to the device by switching the analog signal at predetermined periods and, more particularly, to an electronic volume device which is intended to miniaturize the device and to reduce the cost of the device by using a switching control unit which can be composed of a monolithic LSI (Large Scale Integration).

2. Description of the Related Art

Electric volume devices of a chopper type which have been proposed are shown in FIG. 5 and 6. In the device of FIG. 5, an input analog signal received at an input terminal 1 is turned on and off by an analog switch 2, the output of which is supplied via a low pass filter 3 for removing useless higher harmonics to an output terminal 4 from which the signal appears attenuated by a predetermined quantity. The switch 2 is turned on and off by a switching control signal input to the gate of the switch 2. Thus the duty cycle of the switching control signal is changed to change a quantity of attenuation of the signal output from the output terminal 4.

The switching control signal applied to the gate terminal of the analog switch 2 is formed by a volume control circuit 50. The volume control circuit 50 includes a volume control data generator 6 which generates a volume control data $D_s$ corresponding to a desired quantity of attenuation, a counter 8 which counts clock signals generated by a clock generation source 7 and having a predetermined frequency and which outputs a numerical data signal $D_x$ which changes periodically, and a comparator 9 which compares the volume control data $D_s$ output by the volume control data generator 6 and the numerical data $D_x$ output by the counter 8 and outputs, for example, a high level signal when $D_s > D_x$ and a low level signal when $D_s \leq D_x$. The output signal from the comparator 9 is applied to the gate of the analog switch 2 as the switching control signal.

In such arrangement, the period of the switching control signal output by the volume control circuit 50 is determined by the repeated counting Period of counter 8, and the duty cycle of the switching control signal is determined by the value of the volume control data $D_x$ set in the volume control data generator 6. When the volume control data $D_s$ set in the volume control data generator 6 of the volume control circuit 50 increases, the duty cycle of the switching control signal output by the volume control circuit 50 increases, so that the conductivity of the analog switch 2 increases to thereby reduce the quantity of attenuation of the input analog signal. In contrast, when the volume control data $D_s$ set in the volume control data generator 6 decreases, the duty cycle of the switching control signal output by the volume control circuit 50 decreases to thereby reduce the conductivity of the analog switch 2, and hence increase the quantity of attenuation of the input analog signal.

The structure of FIG. 6 employs a transistor 10 and a capacitor 12 instead of the analog switch 2 in FIG. 5. In this case, the switching control signal output by the comparator 9 of the volume control circuit 51 is applied to the base of the transistor 10 via an invertor 11, thereby controlling the quantity of attenuation of the analog signal as in the example of FIG. 5.

In such electronic volume device, the volume control circuit 50 or 51 can be fabricated as an integrated circuit. For example, it may be fabricated from a MOS (Metal Oxide Semiconductor) LSI (Large Scale Integration), a CMOS (Complementary Metal Oxide Semiconductor) gate array LSI or a bipolar type gate array LSI. Therefore, the volume control circuit of the electronic volume device can be miniaturized and made lighter. However, the circuit parts inclusive of the analog switch 2 shown in FIG. 5 or the transistor 10 shown in FIG. 6 as switching means is difficult to be constituted as a monolithic LSI, so that it requires many circuit parts, which is a big hindrance in the miniaturization, and weight and cost reduction of the electronic volume device. realizes miniaturization, and weight and cost reduction of the volume device.

SUMMARY OF THE INVENTION

According to the present invention, the electronic volume device, inclusive of switching means which switches an input analog signal, is constituted by a monolithic LSI.

In more detail, according to the present invention, there is provided an electronic volume device comprising: a volume control circuit constituted by a monolithic integrated circuit and having a signal output terminal, the output of which is switched alternately to a high impedance state and to a low impedance state, with the ratio in duration of the high impedance state to the low impedance state being controlled in accordance with a desired quantity of attenuation; a signal line through which an input analog signal is applied; means for connecting the signal output terminal of the volume control circuit to the signal line; and a low pass filter connected to the signal line for forming an output signal by eliminating high frequencY components from the signal on the signal line.

According to the inventive electronic volume device, the on/off switching on an analog signal is substantially performed by elements incorporated into the LSI, so that the number of parts used is reduced, and miniaturization, and weight and cost reduction of the device are realized.

DESCRIPTION OF THE PREFERRED EMBODIMENT

Figure 5:
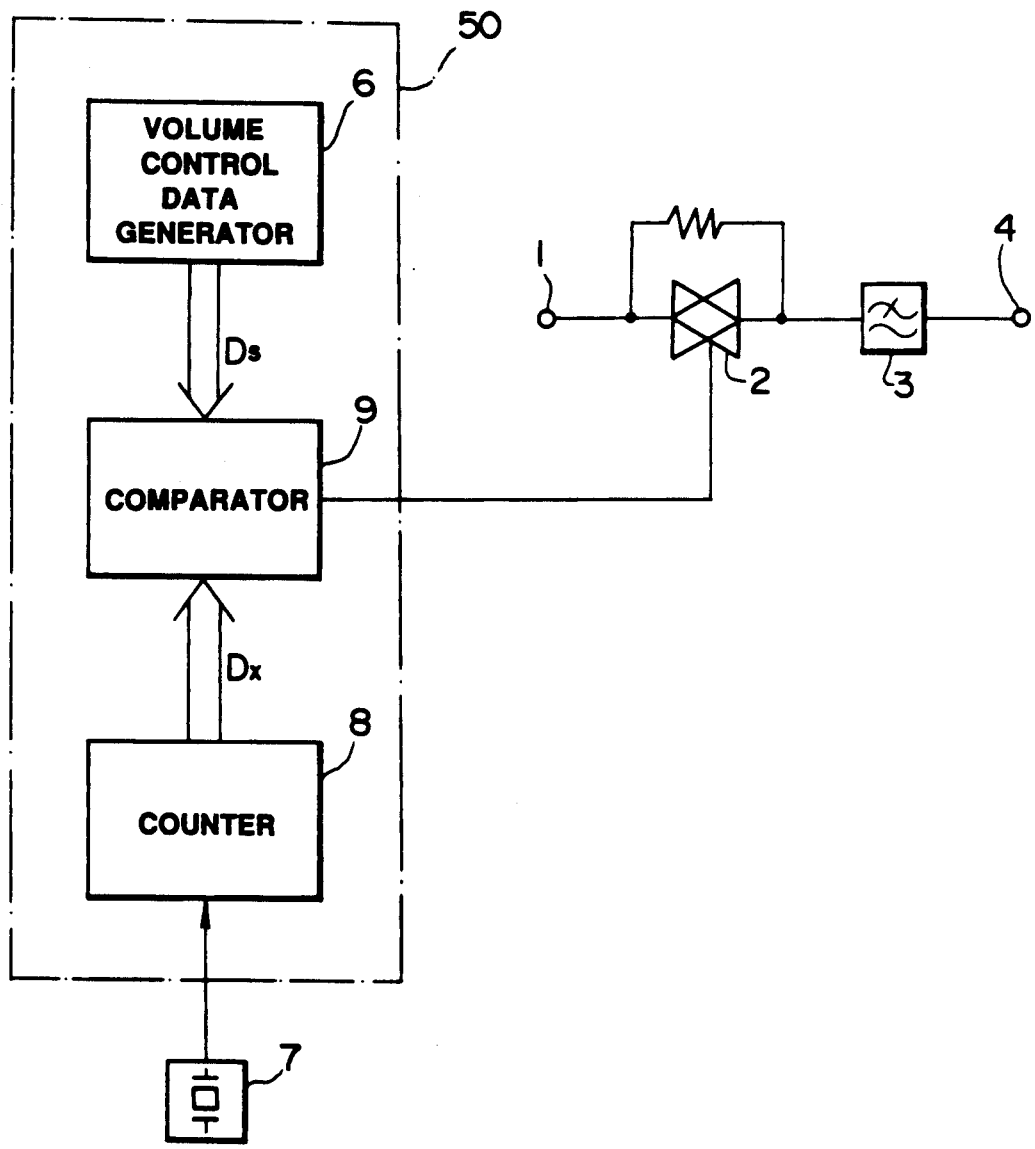
FIG. 5 and 6 each are a block diagram showing an example of a electronic volume device of a chopper type.
Figure 6:
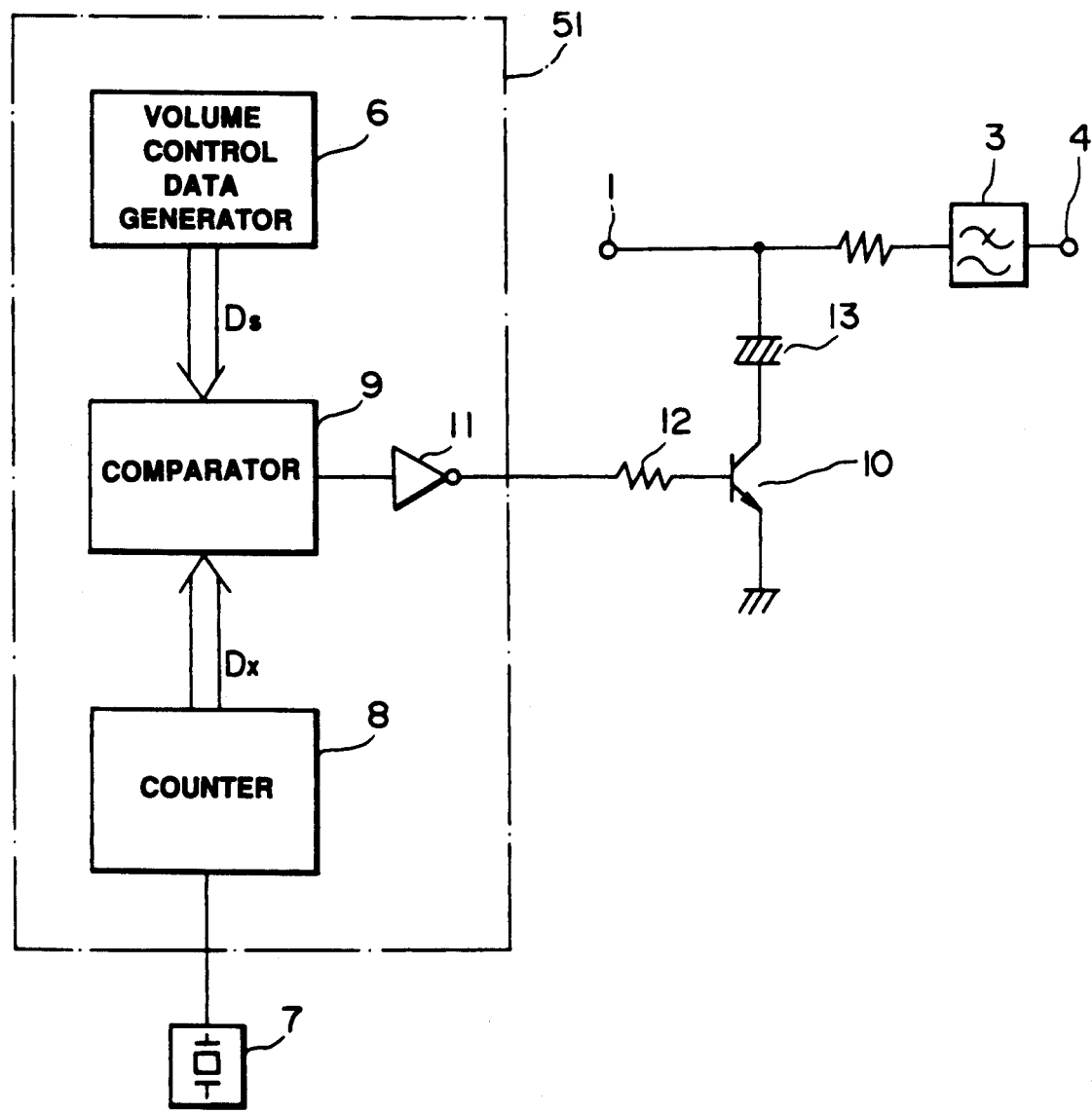

One embodiment of the present invention will now be described in detail with reference to the accompanying drawings. Like reference numerals are given to like components throughout in FIGS. 1, 5 and 6 for convenience of description and further description thereof will be omitted.

Figure 1:
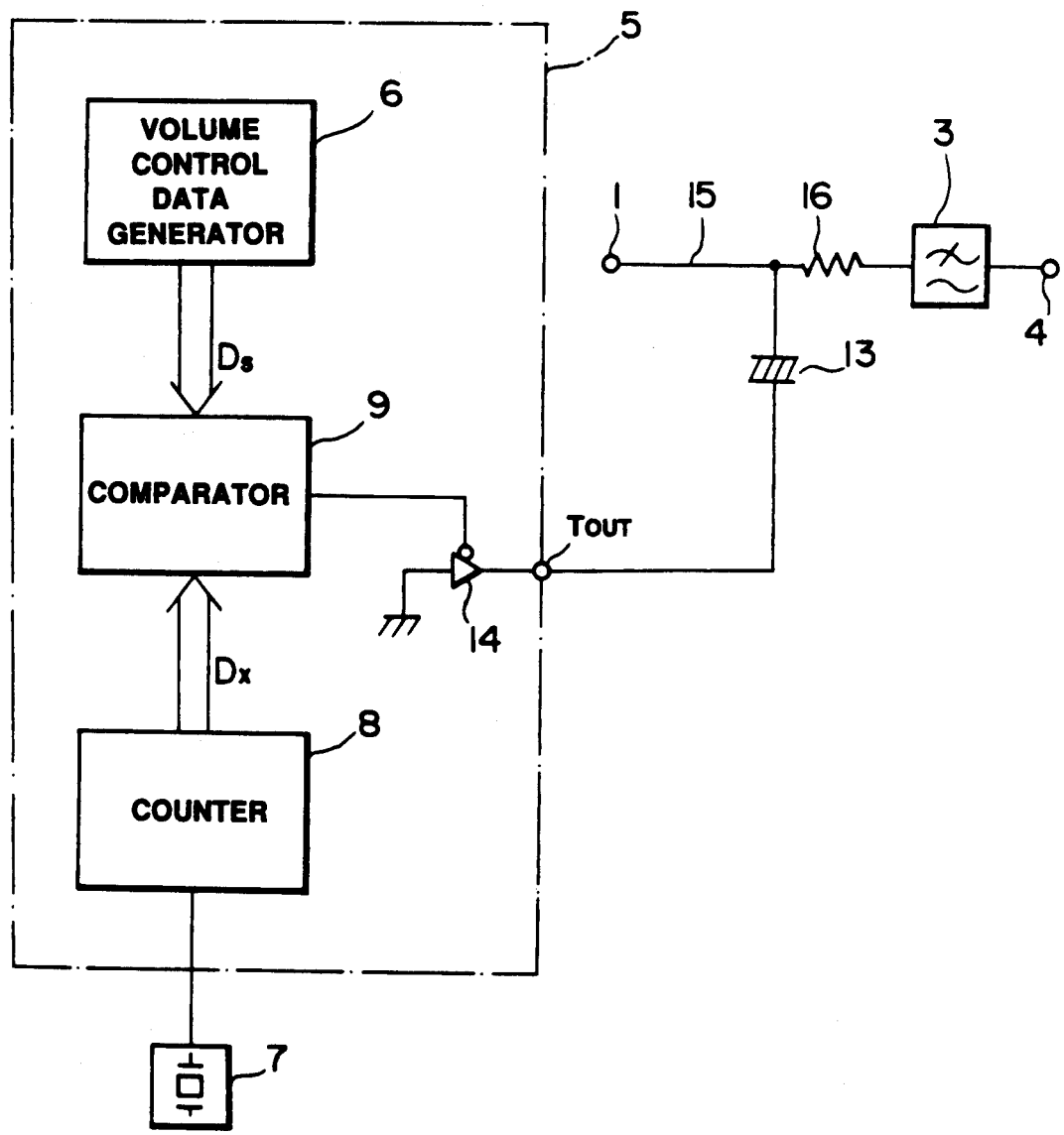
FIG. 1 is a block diagram showing one embodiment of an electronic volume device according to the present invention.

In FIG. 1, an analog signal to be controlled is applied to an input terminal 1. The signal applied to the input terminal 1 is applied to a low pass filter 3 via a signal line 15 and a resistor 16. The signal line 15 is connected to a signal output terminal $T_{out}$ of a volume control circuit 5 via a capacitor 13.

The volume control circuit 5 includes a volume control data generator 6, a counter 8, a comparator 9 and a buffer 14. Volume control data $D_s$ corresponding to a desired quantity of attenuation is set in the volume control data generator 6 which outputs a signal indicative of the volume control data $D_s$. The counter 8 counts clock signals having a predetermined period generated by a clock source 7 and outputs a signal indicative of the numerical data $D_x$ corresponding to the counts. If the counter 8 is, for example, of a 5 bit type (in this case, the volume control data $D_s$ set in the volume control data generator 6 is also of a 5-bit type), the measured data $D_x$ starts to increment from "00000". When the data exceeds "11111", it again becomes "00000" and repeats such behavior. The comparator 9 compares the signal indicative of the volume control data $D_s$ output by the volume control data generator 6 and the signal indicative of the numerical $D_x$ output by the counter 8. When $D_s > D_x$, the comparator 9 outputs a high level switching control signal when $D_s \leq D_x$, the comparator outputs a low level switching, control signal. The switching control signal is then applied to the control input of the buffer 14.

When the switching control signal is at high level, the buffer 14 output is switched to a high impedance state; namely, its output terminal $T_{out}$ is switched to a floating state. When the switching control signal is at low level, the buffer output is switched to a low impedance state; namely, its output terminal $T_{out}$ is switched to a grounded state. The buffer 14 may be constituted by a tri-state buffer or an open drain buffer.

Figure 2:
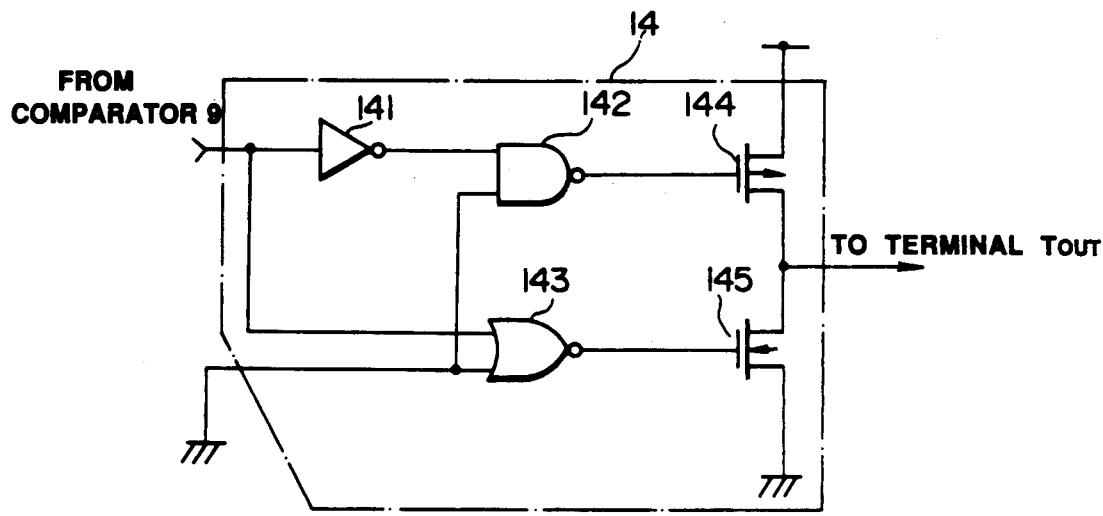
FIG. 2 is a circuit diagram showing one example of a buffer shown in FIG. 1.

The volume control circuit 5 may he constituted, for example, by a monolithic CMOS gate array LSI. In that case, the specific circuit example of the buffer 14 is shown in FIG. 2, and constitutes a tri-state buffer which includes an inverter 141, a NAND gate 142, an OR gate 143 and a p-channel FET (Field Effect Transistor) 144 and n-channel FET 45 each being composed of a monolithic CMOS circuit. In the circuit of FIG. 2, when the signal from the comparator 9 is at high level, the p-channel FET 144 is off, the n-channel FET 145 is also off, and the terminal $T_{out}$ is in a high impedance state or in a floating state. When the signal from the comparator 9 is at low level, the p-channel FET 145 is off, n-channel FET 145 is on and the terminal $T_{out}$ is in a low impedance state or in a grounded state.

Figure 3:
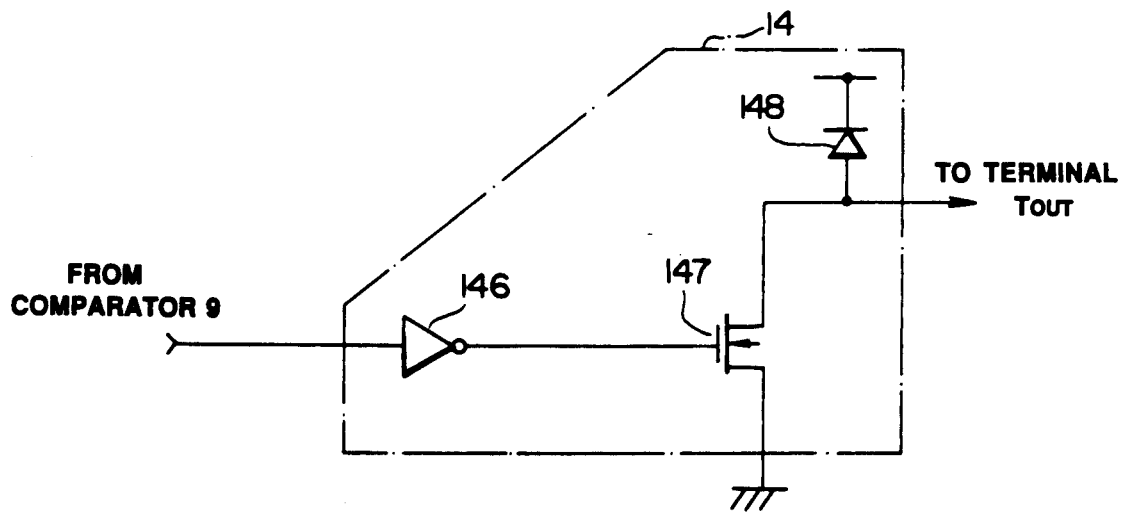
FIG. 3 is a circuit diagram showing another example of the buffer shown in FIG. 1.

FIG. 3 illustrates the buffer 14 constituted as an open drain buffer. It includes an invertor 146, a FET 147 and a diode 148. If the signal from the comparator 9 is at high level, FET 147 is turned off, the terminal $T_{out}$ is in a high impedance state or in a floating state. If the signal from the comparator 9 is at low level, FET 147 is turned on and the terminal $T_{out}$ is in a low impedance state or in a grounded state.

When the signal output terminal $T_{out}$ of the volume control circuit 5 is in a high impedance state or in a floating state, the controlled analog signal applied to the input terminal 1 is applied to the low pass filter 3 via the signal line 15 and resistor 16. However, if the output terminal $T_{out}$ of the volume control circuit 5 is in a low impedance or in a grounded state, the signal on the signal line 15 is grounded via the capacitor 13, terminal $T_{out}$, and buffer 14, so that the controlled analog signal applied to the input terminal 1 is not applied to the low pass filter 3.

As just described, the controlled analog signal applied to the input terminal 1 is turned on/off and then applied to the low pass filter 3 depending on whether the signal output terminal $T_{out}$ of the volume control circuit 5 is in a high impedance state or in a low impedance state. The low pass filter 3 eliminates high frequency components from the on/off-controlled analog signal to form a smoothly changing output signal. The signal passing through the low pass filter 3 is output as an output signal from the output terminal 4.

Figure 4:
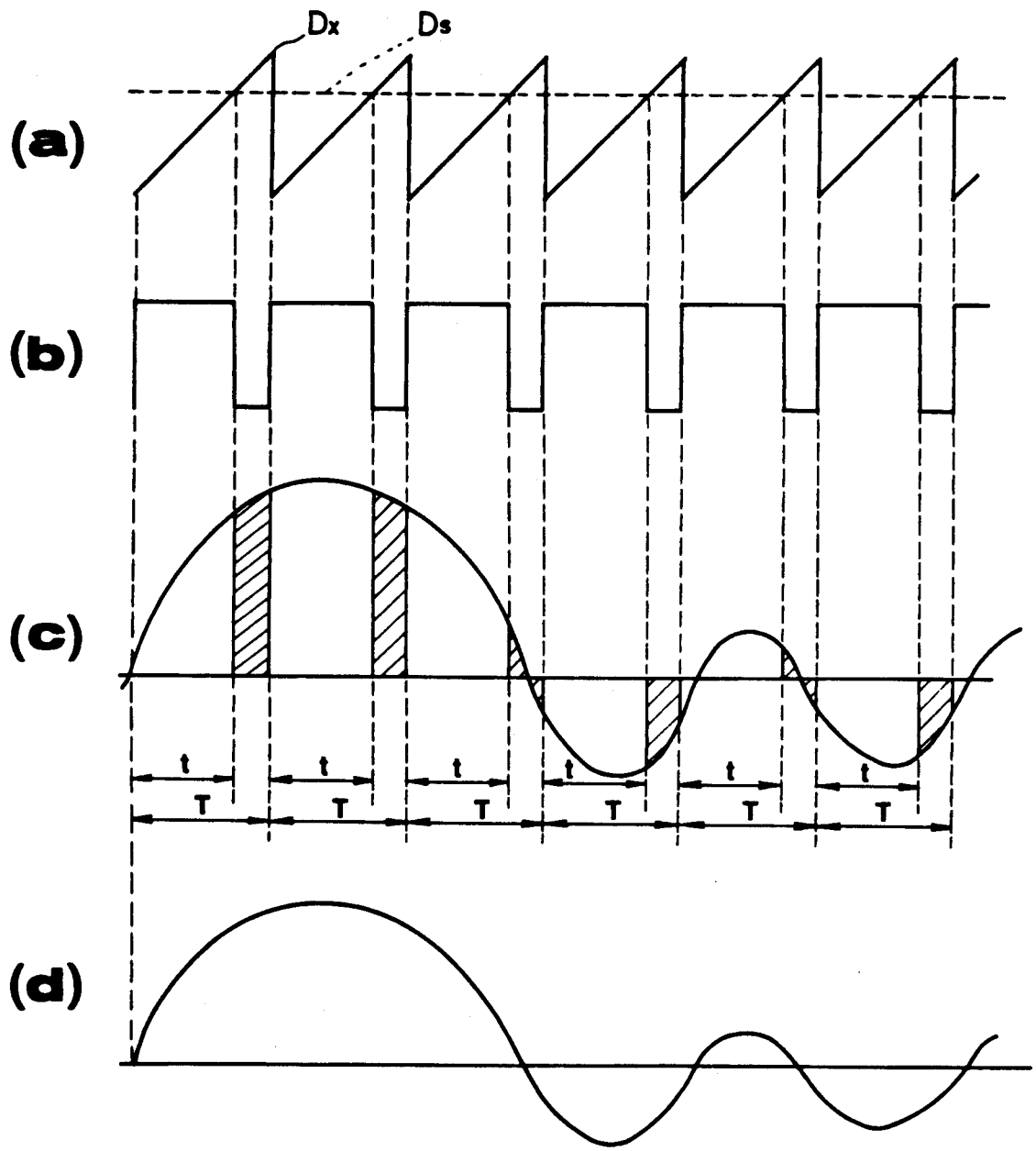
FIG. 4 is a waveform showing the operation of the embodiment shown in FIG. 1.

FIG. 4 shows the state and waveforms of signals at several elements of the embodiment shown in FIG. 1. FIG. 4(a) shows the relationship between numerical data $D_x$ output by the counter 8 and volume control data $D_s$ output by the volume control data generator 6. In FIG. 4(a), the solid line shows the numerical data $D_x$ and the broken line shows the volume control data $D_s$.

FIG. 4(b) illustrates the switching control signal output by the comparator 9 in conjunction with FIG. 4(a). The switching control signal shown in FIG. 4(b) is at high level when $D_s > D_x$ and at low level when $D_s \leq D_x$ in FIG. 4(a). FIG. 4(c) shows the waveform of signals applied to the input terminal 1 and to the low pass filter 3. In FIG. 4(c), the solid line shows the signal applied to the input terminal 1 while the hatching shows zero portions in the signal caused by the low impedance state 5.

FIG. 4(d) illustrates the smooth waveform converted by the low pass filter 3. As will be obvious from this signal, the low pass filter 3 outputs a signal which includes the signal applied to the input terminal 1 and shown in FIG. 4(c) and attenuated by a quantity corresponding to the duty cycle of the switching control signal shown in FIG. 4(b).

The duty cycle D is given by $$D = t/T$$

where t is the switching on time during which the signal output terminal $T_{out}$ of the volume control circuit 5 is in the "high impedance state" in which the analog signal is applied to the low pass filter 3, and T is the period of the signal output from the signal output terminal $T_{out}$ of the volume control circuit 5.

The value of the analog signal integrated during the switching on time t constitutes the transmitted power output from the output terminal 4 via the low pass filter 3. The transmitted power is smoothed by the low pass filter 3 as shown in FIG. 4(d) and output from the output terminal 4.

Therefore, by controlling the value of the duty cycle D, the quantity of power or the quantity of attenuation of the analog signal output from the output terminal 4 is controlled.

What is claimed is:
1. An electronic volume device comprising:
   a volume control circuit constituted by a monolithic integrated circuit and having a signal output terminal, including switching control signal generating means for generating a switching control signal having a duty cycle corresponding to a desired proportion of attenuation, and means for switching the signal output terminal between a floating state and a grounded state in accordance with the switching signal generated by the switching control generating means;

a signal line through which an input analog signal is applied;

means for connecting the signal output terminal of the volume control circuit to the signal line; and a low pass filter connected to the signal line for forming an output signal by eliminating high frequency components from the signal on the signal line.

2. An electronic volume device according to claim 1, wherein the switching control signal generating means includes:

a volume control data generator in which volume control data corresponding to a desired quantity of attenuation is set;

means for counting predetermined clocks to generate a periodically changing numerical signal; and means for comparing the volume control data set in the volume control data generator and the numerical signal generated by the counting means to form the switching control signal.

3. An electronic volume device according to claim 1, wherein the connecting means connects the signal output terminal of the volume control circuit to the signal line through which the input analog signal is applied via a capacitor.

4. An electronic volume device according to claim 1, wherein the switching means includes a tri-state buffer.

5. An electronic volume device according to claim 1, wherein the switching means includes an open drain buffer.

6. An electronic volume device according to claim 1, wherein the volume control circuit is constituted by a monolithic large scale integration of a MOS structure.

7. An electronic volume device according to claim 6, wherein the volume control circuit is constituted by a gate array of large scale integration.

8. An electronic volume device according to claim 1, wherein the volume control circuit is constituted by a monolithic large scale integration and wherein the switching control signal generating means and switching means each are constituted by a same monolithic large scale integration.

9. An electronic volume device according to claim 8, wherein the switching control signal generating means and switching means each are constituted by a monolithic large scale integration of a MOS structure.

10. An electronic volume device according to claim 8, wherein the switching means is constituted by an open drain buffer using a monolithic large scale integration of a MOS structure.

11. An electronic volume device according to claim 9, wherein the switching means is constituted by a tri-state buffer using a monolithic large scale integration of a MOS structure.

* * * * *